United States Patent
Asai et al.

(10) Patent No.: US 6,854,418 B2
(45) Date of Patent: Feb. 15, 2005

(54) INTENSIVE MACHINE FOR PERFORMING A PLURALITY OF PROCESSES IN FABRICATION OF MULTILAYER SUBSTRATE

(75) Inventors: Koichi Asai, Nagoya (JP); Jun Adachi, Nagoya (JP); Tomoyuki Sawa, Nishio (JP); Kazuaki Mori, Anjyo (JP); Hiroshi Oono, Chiryu (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 6 days.

(21) Appl. No.: 10/645,872

(22) Filed: Aug. 22, 2003

(65) Prior Publication Data

US 2004/0206457 A1 Oct. 21, 2004

(30) Foreign Application Priority Data

Aug. 23, 2002 (JP) ........................................ 2002-243136

(51) Int. Cl.⁷ .......................... H05K 3/46; B05C 11/00; B05C 13/00; B41F 21/06
(52) U.S. Cl. ........................... 118/37; 118/46; 118/712; 156/384; 101/415.1; 101/474; 101/DIG. 42
(58) Field of Search ........................... 156/89.12, 89.16, 156/277, 384, 513; 118/664, 665, 37, 712, 46; 101/408, 415.1, 474, DIG. 42

(56) References Cited

U.S. PATENT DOCUMENTS

| | | | | |
|---|---|---|---|---|
| 4,362,486 A | * | 12/1982 | Davis et al. ................. | 425/110 |
| 5,314,711 A | * | 5/1994 | Baccini ....................... | 427/98.2 |
| 5,410,957 A | * | 5/1995 | Tanaka et al. ............... | 101/127 |
| 5,449,409 A | * | 9/1995 | Baccini ....................... | 118/668 |
| 5,505,809 A | * | 4/1996 | Yamamoto et al. ......... | 156/264 |
| 5,540,779 A | * | 7/1996 | Andris et al. ............... | 118/692 |
| 5,567,240 A | * | 10/1996 | Kogame et al. ............ | 118/665 |
| 5,922,168 A | * | 7/1999 | Zablotny et al. ............ | 156/379 |
| 5,935,365 A | * | 8/1999 | Kobayashi et al. ......... | 156/249 |
| 5,942,063 A | * | 8/1999 | Mori ........................ | 156/89.16 |
| 6,109,323 A | * | 8/2000 | Baccini ....................... | 156/378 |
| 2003/0034122 A1 | * | 2/2003 | Asai ........................... | 156/252 |

FOREIGN PATENT DOCUMENTS

| | | | |
|---|---|---|---|
| JP | 62-47137 | * | 2/1987 |
| JP | 4-2196 A | | 1/1992 |
| JP | 5-92406 | * | 4/1993 |
| JP | 5-337923 | * | 12/1993 |
| JP | 7-22734 | * | 1/1995 |
| JP | 2504277 B2 | | 4/1996 |
| JP | 2002-43748 A | | 2/2002 |

* cited by examiner

Primary Examiner—Melvin C. Mayes
(74) Attorney, Agent, or Firm—Foley & Lardner LLP

(57) ABSTRACT

An object of the present invention is to provide an intensive machine performing a plurality of processes in a series of steps of fabricating a multilayer substrate. In order that the object may be achieved, the invention provides an intensive machine including an intensive platform installed in a direction in which a ceramic green sheet is fed out of a roll by a feeding apparatus. An adsorbing and conveying table is installed on the platform for conveying the sheet while the sheet is adsorbed and held by an air suction force. On the intensive platform are installed a via hole forming apparatus, via hole inspecting apparatus, filling and printing apparatus, filling and printing apparatus, filling and printing inspecting apparatus and wiring pattern printing apparatus arranged in the sheet conveying direction.

10 Claims, 12 Drawing Sheets

INTENSIVE MACHINE FOR PERFORMING A PLURALITY OF PROCESSES IN FABRICATION OF MULTILAYER SUBSTRATE

BACKGROUND OF THE INVENTION

1. Field of the Invention

The present invention relates to an intensive machine which can perform a plurality of processes in a series of steps of fabricating a multilayer substrate.

2. Description of the Related Art

Ceramic multilayer substrates are generally fabricated by a green sheet laminating. In the green sheet laminating, via holes for interlayer connection are formed in a plurality of ceramic green sheets by punching or the like, and thereafter, the via holes of each green sheet is filled with a conductive paste by printing and a wiring pattern is provided on an upper side of each ceramic green sheet by screen printing. Subsequently, these green sheets are integrated through lamination and thermocompression bonding, then being fired into a ceramic multilayer substrate.

Thus, in fabricating the ceramic multilayer substrate, at least the steps of forming via holes, filling and printing, printing wiring patterns need to be carried out. In a conventionally general fabrication line, however, a ceramic green sheet formed into the shape of a tape by the doctor blade method is cut into square pieces each having a predetermined size. Thereafter, the steps of forming via holes, filling and printing, printing wiring patterns are carried out. Accordingly, ceramic green sheets need to be positioned at each step and positions of the ceramic green sheets need to be detected at each step. As a result, processing apparatuses used at each fabrication step are complicated and large-sized, and a conveyor is required between the processing apparatuses of the fabrication steps. Consequently, the size and cost of the fabrication line is increased, and the processing apparatuses of the respective steps need to be set up.

In view of the foregoing problems, as shown in JP-A-2002-43748 gazette, a fabricating apparatus called "roll-to-roll" or "roll-to-sheet" has recently been proposed, in which apparatus a ceramic green sheet unwound from a roll has recently been conveyed to a via hole forming station without being cut, and after the via holes have been formed, the sheet is conveyed to a filling and printing station, where the via holes are filled with a conductive paste. Thereafter, a wiring pattern is printed. In the conventional "roll-to-roll" or "roll-to-sheet" system, the ceramic green sheet fed out of the roll is conveyed by a conveyer or take-up force of a take-up roll while being tensioned by tension rollers (see JP-A-4-2196 gazette).

In the foregoing conveying manners, however, a relative positional relation between each portion of the ceramic green sheet with respect to a conveying direction varies depending upon an amount of flexure of the ceramic green sheet due to the tension rollers. Accordingly, the ceramic green sheet needs to be positioned at each step and the position of the ceramic green sheet needs to be detected at each step. As a result, processing apparatuses used at each fabrication step are complicated, and the cost for each processing apparatus is increased. Moreover, the roller tension needs to be adjusted according to the thickness of and material for the ceramic green sheet. Additionally, since the mounting accuracy of each roller affects the accuracy in the feed of the ceramic green sheet, the number of assembling steps is increased.

SUMMARY OF THE INVENTION

Therefore, an object of the present invention is to provide an intensive machine which can perform a plurality of processes in a series of steps of fabricating a multilayer substrate, realize small-sized fabricating installation, a reduction in the number of assembling steps and low costs, ensure a stable sheet conveying accuracy without adjustment of roller tension according to the thickness or material of a sheet made into a multilayer substrate, and fabricate high quality of products efficiently.

To achieve the object, the present invention provides an intensive machine performing a plurality of processes in a series of steps of fabricating a multilayer substrate, comprising a roll of insulating sheet formed into an insulating layer of each of a plurality of layers of the multilayer substrate, an adsorbing and conveying table adsorbing the sheet fed out of a roll of insulating sheet formed into an insulating layer of each of a plurality of layers of the multilayer substrate, by an air suction force and holding the adsorbed sheet, the table further conveying the sheet while holding the sheet, an intensive platform supporting the adsorbing and conveying table so that the table is reciprocally moved in a conveying direction of the table and a direction opposed to the conveying direction, a via hole forming apparatus provided on the intensive platform for forming a via hole in the sheet held on the table in an adsorbed state, a filling and printing apparatus provided on the platform so as to be disposed over the sheet having passed the via hole forming apparatus by a conveying operation of the table to fill the via hole with a conductor paste and print the conductor paste on the sheet, and a wiring pattern printing apparatus provided on the platform so as to be disposed over the sheet having passed the filling and printing apparatus by a feeding operation of the table to print a wiring pattern on the sheet.

Thus, the adsorbing and conveying table is used as means for conveying the sheet fed from the roll of insulating sheet formed into the multilayer substrate. When the sheet is adsorbed onto the adsorbing and conveying table by the air suction force (vacuum pressure) and conveyed in the adsorbed and held state, the sheet need not be tensioned by bending the sheet by tension rollers or the like during conveyance, and the sheet can be conveyed in a straight flat state. Accordingly, relative misregistration of the sheet in the conveying direction is eliminated, whereupon a desired sheet conveying pitch accuracy can be ensured, the sheet need not be positioned and the position of the sheet need not be detected for the apparatus of every step, and accordingly, the apparatus at each step can be simplified. Consequently, the apparatuses for a plurality of steps can be intensively provided on the intensive platform, small-sized fabricating installation, a reduction in the number of assembling steps and low costs can be realized. Moreover, a stable sheet conveying accuracy can be ensured without adjustment of roller tension according to the thickness and material of the sheet for forming the multilayer substrate, and high quality of products can be fabricated efficiently.

In this case, a via hole inspecting apparatus may be provided between the via hole forming apparatus, and the filling and printing apparatus may be provided for inspecting a failure in the via hole and a filling and printing inspecting apparatus provided between the filling and printing apparatus for inspecting quality in the filling and printing of the via hole. Consequently, since a single intensive machine can be provided with functions of via hole inspection and filling and printing inspection, products having defective via holes or defective filling and printing can automatically be eliminated.

Furthermore, distances between the via hole forming apparatus, the filling and printing apparatus and the wiring pattern printing apparatus may be set so that steps of via hole forming, filling and printing and wiring pattern printing are carried out simultaneously.

More specifically, distances between the via hole forming apparatus, the filling and printing apparatus and the wiring pattern printing apparatus may be set so that while a via hole is being formed in the sheet by the via hole forming apparatus, a sheet portion with a previously formed via hole is located at the location of the filling and printing apparatus and a sheet portion with a previously filled and printed portion is located at the location of the wiring pattern printing apparatus. Consequently, three steps of via hole forming, filling and printing, and wiring pattern printing can be carried out simultaneously, and accordingly, the production efficiency can be improved.

The sheet used for forming the multilayer substrate may be a ceramic green sheet or a plastic sheet made into a multilayer substrate. When the sheet is the ceramic green sheet, a ceramic green sheet with a carrier film should be used, and the via hole should be formed only in the ceramic green sheet so that the via hole does not extend through the carrier film.

Consequently, even when the via hole is formed in a portion of the ceramic green sheet adsorbed by the adsorbing and conveying table, the underside of the via hole is closed by the carrier film, whereupon the air suction force (vacuum pressure) of the adsorbing and conveying table can be prevented from leaking through the via hole and accordingly, the ceramic green sheet can stably be adsorbed and held via the carrier film on the adsorbing and conveying table. The carrier film may be separated from the ceramic green sheet before a step of laminating the ceramic green sheets.

In order that the air suction force (vacuum pressure) may be applied to the sheet, the top of the adsorbing and conveying table needs to be comprised of a porous plate. However, the air suction force deforms the sheet when the porous plate has a large pore diameter. Accordingly, the pore diameter of the porous plate needs to be rendered minute. As a method of forming the porous plate, it is supposed that a metal plate is made into a porous plate by punching. However, it is difficult to form minute pores by punching in a metal plate with such an increased thickness that a strength required for the top of the adsorbing and conveying table may be ensured. It is then supposed that a porous plate is made of a sintered metal, but the sintered metal is disadvantageously expensive.

In order that the problem may be overcome, the adsorbing and conveying table has a top comprising a laminated porous plate made by laminating at least two metal plates each having a number of minute pores, and the metal plates are laminated so that the pores of the upper metal plate face the pores of the lower metal plate and the pores of the upper metal plate are smaller than the pores of the lower metal plate.

More specifically, a metal plate with a small thickness can be formed with minute pores by punching etc. but cannot ensure the strength required for the top of the adsorbing and conveying table. On the other hand, a metal plate with a large thickness can ensure the required strength but minute pores cannot be formed in the metal plate. However, the laminated porous plate is formed by stacking a metal plate having a larger thickness and larger pores formed by punching on a thinner metal plate having smaller pores formed by punching etc. When the laminated porous plate is used, the thinner metal plate formed with minute pores can be reinforced by the thicker metal plate having a higher strength, at the underside of the thinner metal plate. Consequently, the top of the adsorbing and conveying table has required small pore diameter and higher strength. Moreover, the laminated porous plate is advantageously less expensive than the continuously porous sintered metal.

Furthermore, the adsorbing and conveying table includes a take-in side and a take-out side on both of which adsorbing fixed tables are provided respectively. The adsorbing and conveying table is moved reciprocally between the take-in and take-out side adsorbing fixed tables, thereby conveying the sheet. The sheet is released from adsorption by each of the take-in and take-out side adsorbing fixed tables when conveyed while being adsorbed on the adsorbing and conveying table. The sheet is released from adsorption by the adsorption and conveying table when the adsorption and conveying table is moved backward to the direction opposite the conveying direction. The sheet is adsorbed by the take-in and take-out side adsorbing fixed tables so as to be prevented from displacement. Consequently, since the sheet can be prevented from displacement when the adsorption and conveying table is moved backward in the direction opposite the conveying direction, a desired sheet conveying pitch accuracy can be maintained and the sheet can be conveyed in a straight flat state.

When a wiring pattern printing step is a final step of the intensive machine, there is a possibility that a part of screen mask used for wiring pattern printing may extend over the take-out side adsorbing fixed table. In this case, since the wiring pattern placed over the take-out side adsorbing and conveying table is undried, the screen mask may adhere to the undried wiring pattern of the sheet on the take-out side adsorbing and conveying table when the take-out side adsorbing and conveying table is installed horizontally, whereupon a line width of the undried wiring pattern may blot and spread or become blurred. Thus, the quality of the printed wiring pattern would be reduced.

As a countermeasure, the take-out side adsorbing fixed table includes a top inclined downward toward the take-out side. Consequently, the screen mask can be prevented from adhering to the undried wiring pattern of the sheet on the take-out side adsorbing fixed table and accordingly, the undried wiring pattern can be prevented from blotting or blurring.

The sheet fed out of the adsorbing and conveying table can be conveyed in a straightly stretched state when tensioned so as to be stretched in the conveying direction in the case where the sheet is conveyed while being adsorbed and held on the adsorbing and conveying table. Consequently, the sheet feed pitch accuracy can further be improved. However, when a tension roller is used as means for tensioning the sheet, the tension roller may be brought into contact with the undried wiring pattern of the sheet, whereupon the line width of the undried wiring pattern may blot and spread or become blurred. Thus, the quality of the printed wiring pattern would be reduced.

As a countermeasure, the intensive machine further comprises a feed roller catching the sheet fed from the adsorbing and conveying table so that the sheet hangs down on the feed roller, a tensioning apparatus including a clamping unit and suspended on widthwise ends of the sheet hanging down from the feed roller by the clamping unit, thereby tensioning the sheet, a raising apparatus raising the tensioning apparatus, and a control device controlling the clamping unit of the tensioning apparatus and the raising apparatus. In this construction, every time the tensioning apparatus is descended to a predetermined descending position, the control device releases the clamping unit from a clamping state and controls the raising apparatus so that the tensioning apparatus is raised to a predetermined ascending position and thereafter, controls the raising apparatus so that the clamping unit clamps the widthwise ends of the sheet so that the tensioning apparatus is suspended on the widthwise ends of the sheet. Consequently, the tensioning apparatus can tension the sheet without coming into contact with the undried wiring pattern of the sheet.

In this case, the sheet cannot be tensioned when the tensioning apparatus is raised to the predetermined ascending position. Accordingly, the control device controls so that raising the tensioning apparatus to the predetermined ascending position is carried out during stop of the adsorbing and conveying table. During stop of the adsorbing and conveying table, the sheet can be maintained in the straightly stretched state without being tensioned.

Furthermore, the intensive machine further comprises a clamping and fixing apparatus provided over the tensioning apparatus for clamping and fixing the widthwise ends of the sheet. In this construction, every time the tensioning apparatus is descended to a predetermined descending position, the control device controls so that the widthwise ends of the sheet are clamped by the clamping and fixing apparatus during stop of the adsorbing and conveying table, thereby fixing a position of the sheet, and thereafter releases the clamping unit of the tensioning apparatus from the clamping state and controls so that the tensioning apparatus is raised to the predetermined ascending position by the raising apparatus, the control device thereafter controlling so that the clamping unit of the tensioning apparatus clamps the widthwise ends of the sheet so that the tensioning apparatus is suspended on the widthwise ends of the sheet, and thereafter releasing the clamping and fixing apparatus from the clamping state. Consequently, since the position of the sheet can be fixed by the clamping and fixing apparatus when the tensioning apparatus is raised, displacement of the sheet can reliably be prevented when the tensioning apparatus is raised.

BRIEF DESCRIPTION OF THE DRAWINGS

Other objects, features and advantages of the present invention will become clear upon reviewing the following description of the embodiments, made with reference to the accompanying drawings, in which.

DETAILED DESCRIPTION OF THE INVENTION

Figure 1:
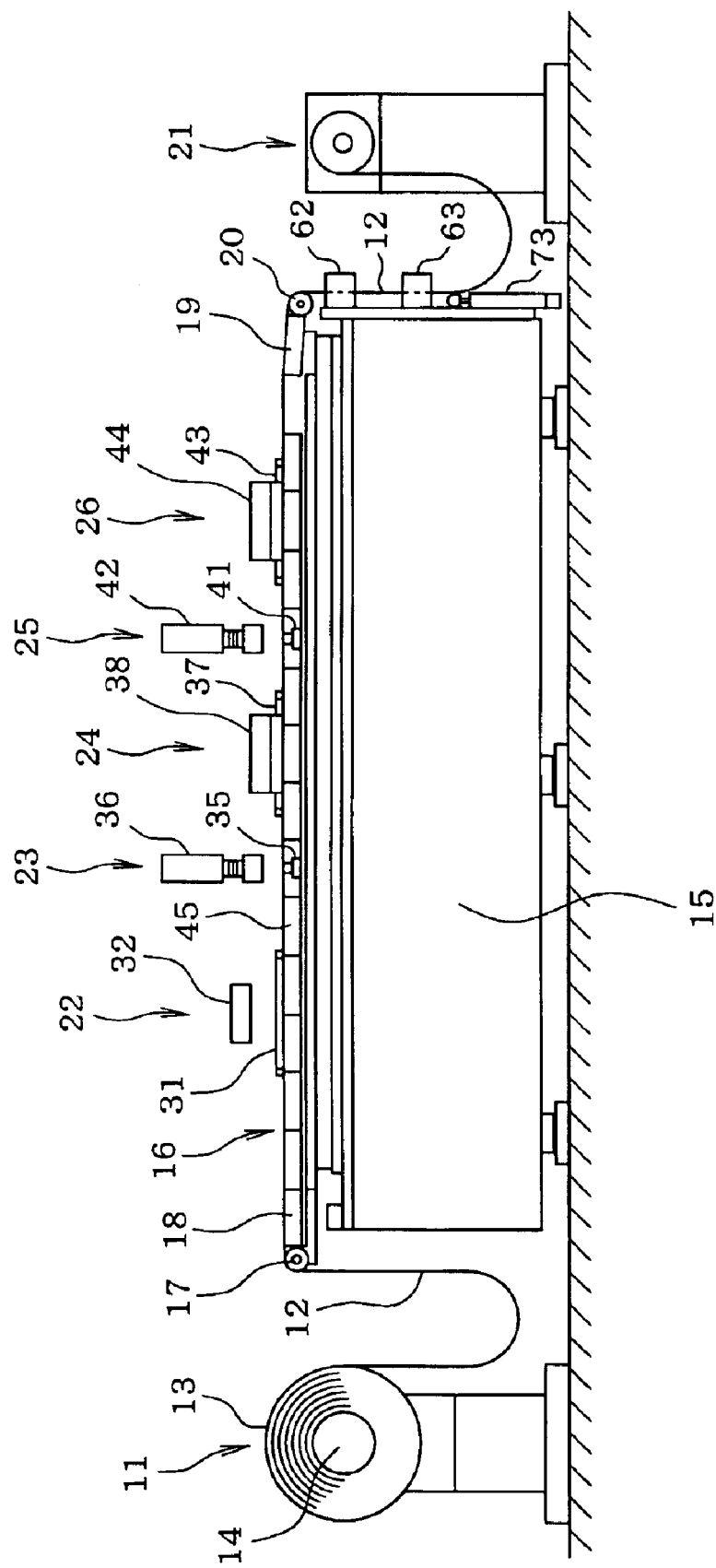
FIG. 1 is a front view of the intensive machine in accordance with one embodiment of the present invention.

One embodiment of the present invention will be described with reference to the drawings. The construction of an intensive machine of the roll-to-roll type will be outlined with reference to FIG. 1. The intensive machine performs a plurality of processes in a series of steps of fabricating a multilayer substrate.

A sheet feeding apparatus 11 includes a roll 13 of a ceramic green sheet 12 which is an insulating sheet formed into an insulating layer of each layer of the multilayer substrate. The roll 13 is attached to a rotor (rotary cylinder) of an electric motor 14 of the outer rotor type so that the ceramic green sheet 12 is fed out when the motor is driven.

An intensive platform 15 is installed so as to extend in a feeding direction of the sheet feeding apparatus 11. An adsorbing and conveying table 16 is installed on the intensive platform 15. The adsorbing and conveying table 16 conveys the ceramic green sheet 12 while adsorbing and holding the sheet by an air suction force. At the sheet take-in side of the intensive platform 15 (left side in FIG. 1) are provided a feed roller 17 for feeding the ceramic green sheet 12 onto the adsorbing and conveying table 16 and a take-in side adsorbing fixed table 18. When the adsorbing and conveying table 16 is returned in the direction opposite the feeding direction, the take-in side adsorbing fixed table 18 adsorbs and holds the ceramic green sheet 12, thereby preventing the ceramic green sheet 12 from returning. The feed roller 17 incorporates an electric motor of the outer rotor type (not shown) for driving the roller.

Before the ceramic green sheet 12 is adsorbed onto the take-in side adsorbing fixed table 18, the feed roller 17 is rotated in the direction opposite the conveying direction so that the ceramic green sheet 12 is tensioned, whereupon occurrence of creases is prevented on the take-in side adsorbing fixed table 18. For the purpose of prevention of creases in the ceramic green sheet 12 on the take-in side adsorbing fixed table 18, usual adsorption of the ceramic green sheet 12 on the adsorbing and conveying table 16 is supposed other than reverse rotation of the feed roller 17. The feed roller 17 may be made from an adhesive material.

A take-out side adsorbing fixed table 19 and a feed roller 20 are provided at the sheet take-out side of the intensive platform 15 (right side in FIG. 1). When the adsorbing and conveying table 16 is returned in the direction opposite the conveying direction, the take-out side adsorbing fixed table 19 adsorbs and holds the ceramic green sheet 12, thereby preventing the sheet 12 from returning. The take-out side adsorbing fixed table 19 includes a top inclined downward toward the take-out side. The ceramic green sheet 12 fed from the feed roller 20 is wound up by a sheet take-up device 21. Before the ceramic green sheet 12 is adsorbed onto the take-out side adsorbing fixed table 19, the feed roller 20 is rotated in the conveying direction so that the ceramic green sheet 12 is tensioned, whereby creases are prevented from occurring in the ceramic green sheet 12 on the take-out side adsorbing fixed table 19.

On the intensive platform 15 are installed a via hole forming apparatus 22, a via hole inspecting apparatus 23, a filling and printing apparatus 24, a filling and printing inspecting apparatus 25 and a wiring pattern printing apparatus 26 all of which are arranged in the conveying direction.

Figure 2:
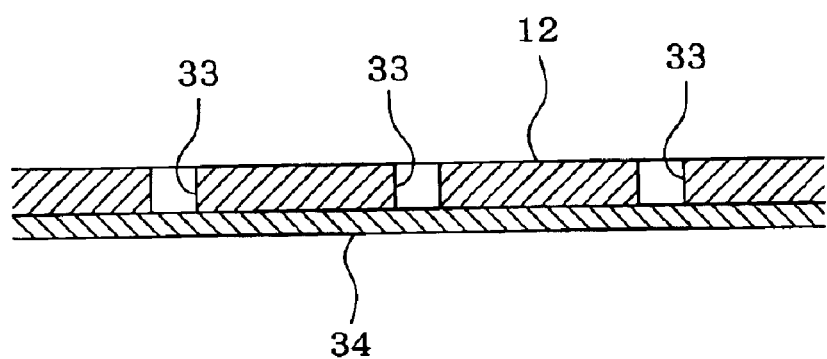
FIG. 2 is a partially enlarged longitudinal section of a ceramic green sheet with carrier film.

The via hole forming apparatus 12 comprises a sand-blasting machine, for example. A sand-blasting mask 31 is set on the ceramic green sheet 12, and sand (blasting powder) is blasted downward so that via holes 33 are formed in the ceramic green sheet 22 (see FIG. 2). In this case, as shown in FIG. 2, a carrier film 34 is laminated on the underside of the ceramic green sheet 12, and the via holes 33 are formed only in the ceramic green sheet 12 so that the via holes 33 are prevented from extending through the carrier film 34. Sand-blasting is employed as a method of forming the via holes 33 only in the ceramic green sheet 12.

The via hole inspecting apparatus 23 is installed between the via hole forming apparatus 22 and the filling and printing apparatus 24. A first light source 35 is disposed below the ceramic green sheet 12, whereas a one-dimensional camera 36 (a line sensor) is disposed above the ceramic green sheet 12. The one-dimensional camera 36 is opposed to the first light source 35 with the sheet 12 interposed therebetween. The one-dimensional camera 36 is installed so as to cover the overall width of an inspecting region of the sheet 12 (overall width in the direction perpendicular to the conveying direction). For example, a fluorescent lamp, halogen light source, fiber light source (a light source guiding light from a halogen light source etc. by fiber), etc. may be used as the first light source 35. A plurality of one-dimensional cameras 36 may be juxtaposed so as to cover the overall width of the inspecting region of the sheet 12.

The filling and printing apparatus 24 comprises a screen printing apparatus. A screen mask 37 is set on the sheet 12, and a conductor paste supplied onto the screen mask is spread by a squeegee 38 so that the via holes 33 are filled with a conductor paste supplied from an opening of the screen mask.

The filling and printing inspecting apparatus 25 is installed between the filling and printing apparatus 24 and the wiring pattern printing apparatus 26 and has the same construction as the via hole inspecting apparatus 23. A second light source 41 is disposed below the ceramic green sheet 12, whereas a one-dimensional camera 42 (a line sensor) is disposed above the ceramic green sheet 12. The one-dimensional camera 42 is opposed to the second light source 41 with the sheet 12 interposed therebetween. The one-dimensional camera 42 is installed so as to cover the overall width of an inspecting region of the sheet 12 (overall width in the direction perpendicular to the conveying direction). For example, a fluorescent lamp, halogen light source, fiber light source (a light source guiding light from a halogen light source etc. by fiber), etc. may be used as the second light source 41. A plurality of one-dimensional cameras 42 may be juxtaposed so as to cover the overall width of the inspecting region of the sheet 12.

The wiring pattern printing apparatus 26 comprises a screen printing apparatus as the filling and printing apparatus 24. A screen mask 43 is set on the sheet 12, and a conductor paste supplied onto the screen mask is spread by a squeegee 44 so that the conductor paste is pushed out of an opening of the screen mask onto the sheet 12 so that a wiring pattern is printed.

In this case, distances between the via hole forming apparatus, the filling and printing apparatus 24 and the wiring pattern printing apparatus 26 are set so that steps of via hole forming, filling and printing, and wiring pattern printing are carried out simultaneously. More specifically, distances between the via hole forming apparatus 22, the filling and printing apparatus 24 and the wiring pattern printing apparatus 26 are set so that while the via holes 33 are formed in the sheet 12 by the via hole forming apparatus 22, a sheet portion with a previously formed via hole 33 is located at the location of the filling and printing apparatus 24 and a sheet portion with a previously filled and printed portion is located at the location of the wiring pattern printing apparatus 26.

Figure 4:
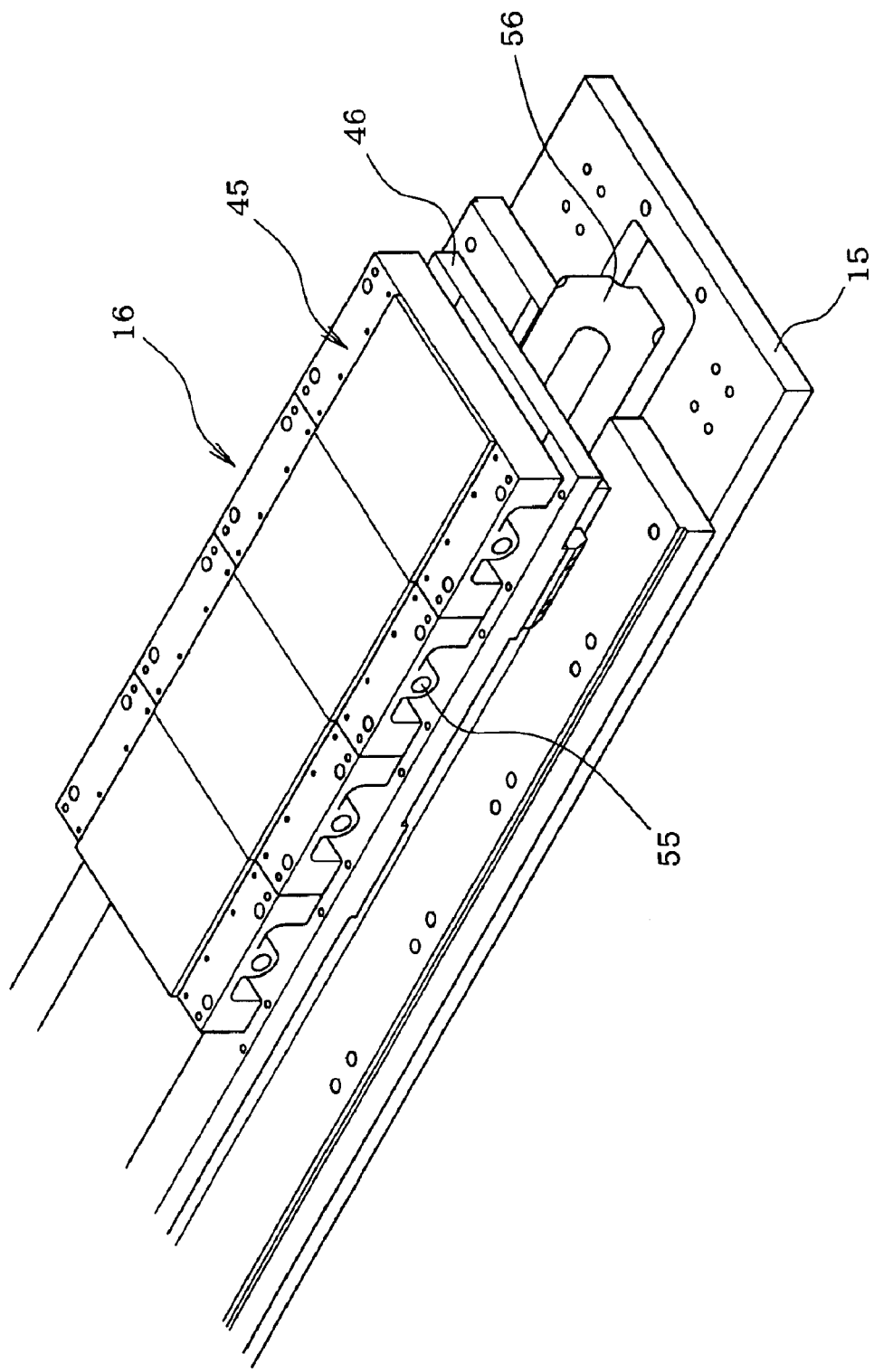
FIG. 4 is a perspective view of an adsorbing and conveying table.
Figure 5:
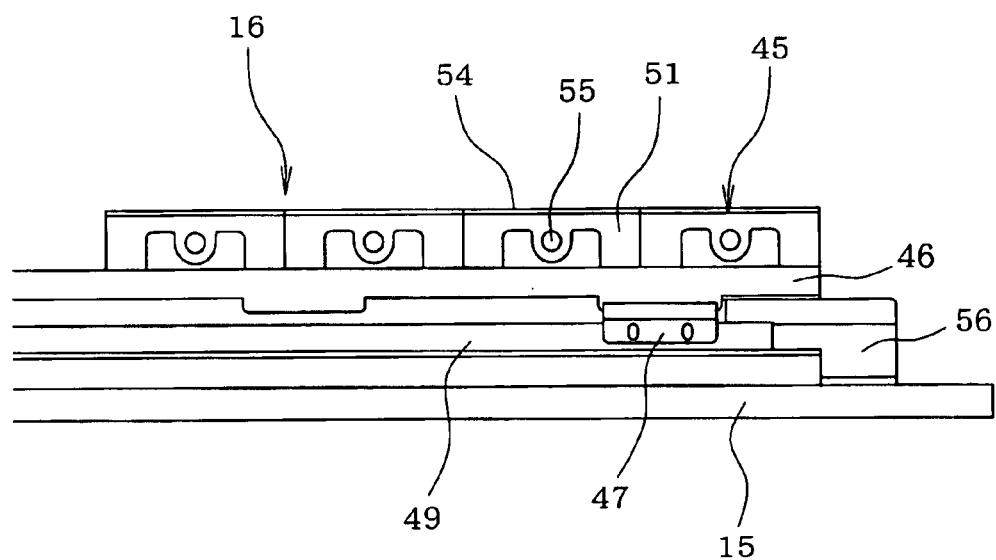
FIG. 5 is a front view of the adsorbing and conveying table.
Figure 6:
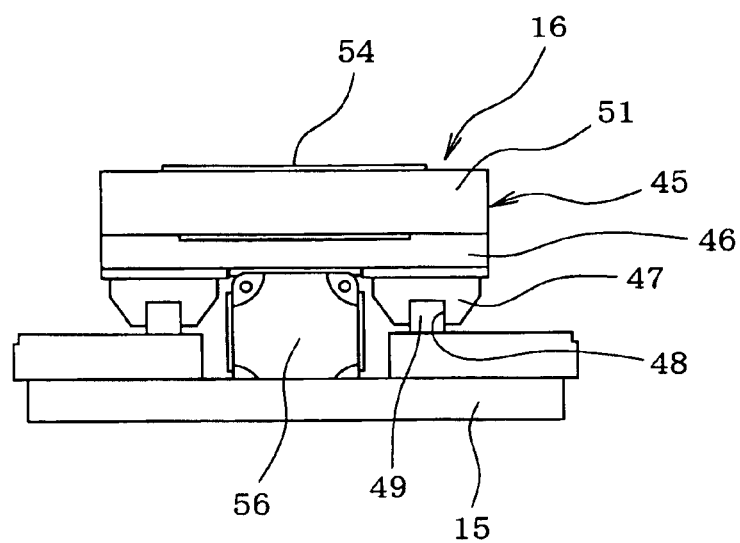
FIG. 6 is a side view of the adsorbing and conveying table.
Figure 7:
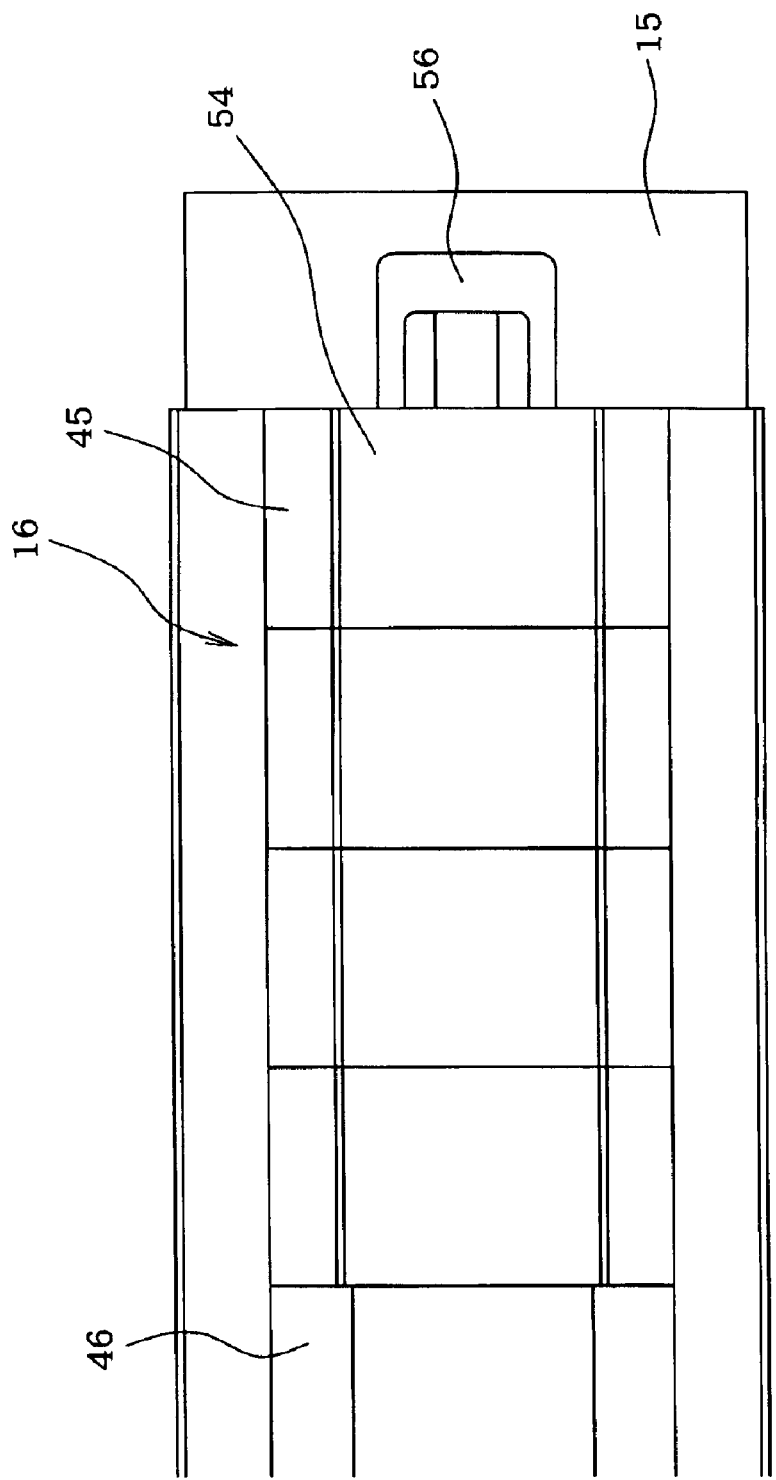
FIG. 7 is a plan view of the adsorbing and conveying table.
Figure 8:
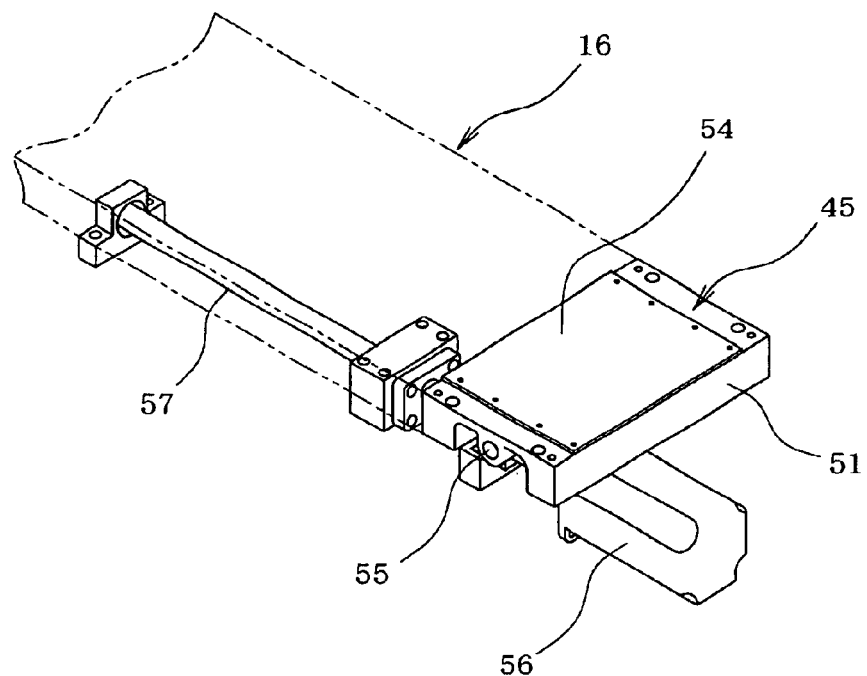
FIG. 8 is a perspective view of major part of the drive mechanism for the adsorbing and conveying table.
Figure 9:
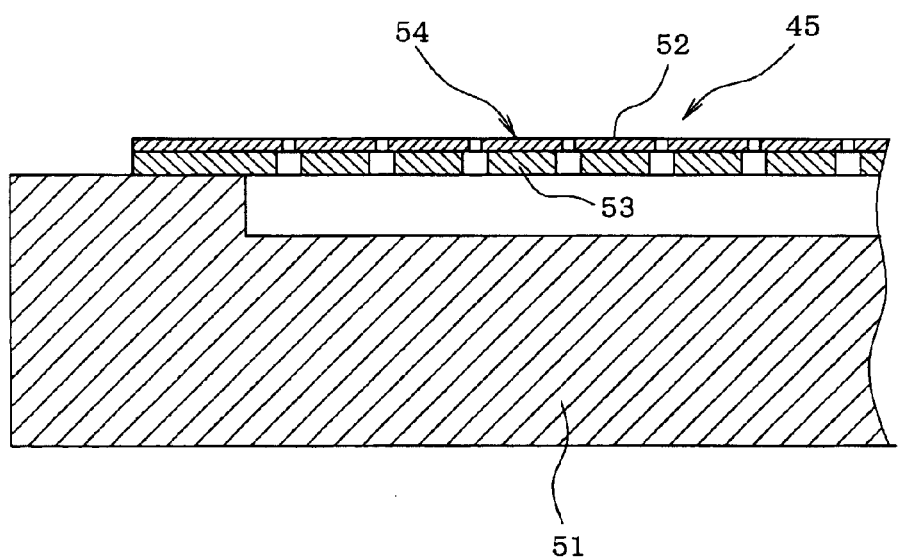
FIG. 9 is a partial sectional view of an adsorbing box.

The construction of the adsorbing and conveying table 16 will be described with reference to FIGS. 4 to 9. FIG. 4 is a perspective view of the adsorbing and conveying table 16. FIG. 5 is a front view of the adsorbing and conveying table 16. FIG. 6 is a side view of the adsorbing and conveying table 16. FIG. 7 is a plan view of the adsorbing and conveying table 16. FIG. 8 is a perspective view of major part of the drive mechanism for the adsorbing and conveying table 16. FIG. 9 is a partial sectional view of an adsorbing box 45.

The adsorbing and conveying table 16 comprises a plurality of adsorbing boxes 45 aligned in a row on a base plate 46 in the conveying direction. As shown in FIG. 6, rails 49 provided on the intensive platform 15 are slidably fitted into rail grooves 48 of slide members 47 provided on the underside of the base plate 46 respectively, whereby the adsorbing and conveying table 16 is slidably supported on the rails 49. The rails 49 extend horizontally in the conveying direction.

Each adsorbing box 45 comprises a metal main body box 51 and a laminated porous plate 54 mounted on the top of the main body box 51 and including two metal plates 52 and 53 laminated and each having a number of minute pores, as shown in FIG. 9. The pores of the upper metal plate 52 face the pores of the lower plate 53. The upper metal plate 52 comprises a thin metal plate which can readily be punched and is made by forming minute pores in the metal plate by punching or the like. The lower metal plate 53 comprises a metal plate having a higher strength and a larger thickness and is made by forming larger pores by punching etc. in the lower metal plate than those in the upper metal plate 52. Each adsorbing box 45 has an air suction inlet 55 (see FIGS. 4 and 5) which is connected via a rubber hose (not shown) and a pressure switching valve (not shown) or the like to a vacuum pump (not shown). The pressure switching valve comprises a three-way valve switching between a position where vacuum pressure of a vacuum pump is introduced into the adsorbing box 45 and a position where atmospheric pressure is introduced into the adsorbing box 45.

Each of the take-in and take-out adsorbing fixed tables 18 and 19 also comprises the adsorbing box 45. The take-in and take-out adsorbing fixed tables 18 and 19 are connected via a pressure switching valve of another system (not shown) to the vacuum pump (not shown). When the ceramic green sheet 12 adsorbed on the adsorbing and conveying table 16 is conveyed, the atmospheric pressure is introduced into the take-in and take-out adsorbing fixed tables 18 and 19 so that the sheet 12 is released from adsorption by the take-in and take-out adsorbing fixed tables 18 and 19. Thereafter, when the adsorbing and conveying table 16 is moved back in the direction opposite the conveying direction, the atmospheric pressure is introduced into each adsorbing box 45 of the table so that the sheet 12 is released from adsorption by the table 16, and the vacuum pressure is introduced into the take-in and take-out adsorbing fixed tables 18 and 19 so that the sheet 12 is adsorbed by the tables 18 and 19. As a result, the sheet 12 is prevented from displacement when the table 16 is moved back.

An electric motor 56 serving as a drive source for the adsorbing and conveying table 16 is fixed to the intensive platform 15. The motor 56 includes a rotational shaft to which a feed screw 57 (see FIG. 8) is connected. Rotation of the motor 56 is converted by the feed screw 57 to linear motion of the table 16 so that the table 16 is slid linearly. In this case, the motor 56 is rotated in the normal and reverse direction so that the table 16 is reciprocated between the take-in and take-out adsorbing fixed tables 18 and 19. The stop position of the table 16 may be determined by detecting the position of the table 16 by a sensor etc. or may be estimated on the basis of an amount of rotation (a rotational angle) of the motor 56. A reciprocating mechanism of the table 16 should not be limited to the combination of the motor 56 and feed screw 57. For example, an air cylinder, hydraulic cylinder or the like may be used.

Figure 3:
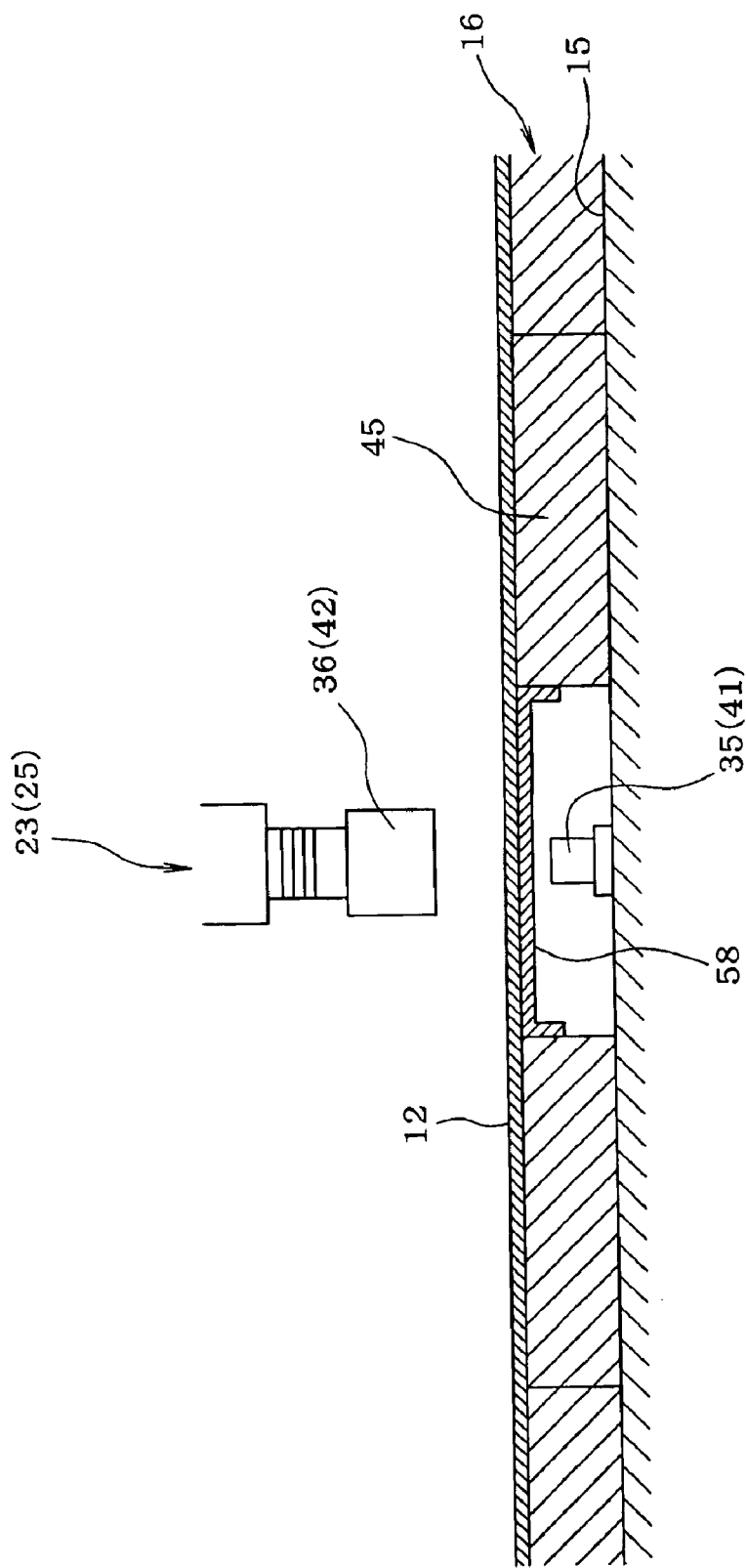
FIG. 3 is a front view of a via hole forming apparatus.

As shown in FIG. 3, no adsorbing box is provided in a part of the table 16 corresponding to each of the via hole inspecting apparatus 23 and the filling and printing inspecting apparatus 25, whereupon the part is a void space. A transparent plate 58 (for example, transparent glass plate, transparent plastic plate or the like) is fixed to the adsorbing boxes 45 so as to be on a level of the tops of the adsorbing boxes. A light source 35 or 41 is disposed in the space defined below the transparent plate 58. The positional relation between the light sources 35 and 41 and the one-dimensional cameras 36 and 42 may be turned upside down.

Figure 10:
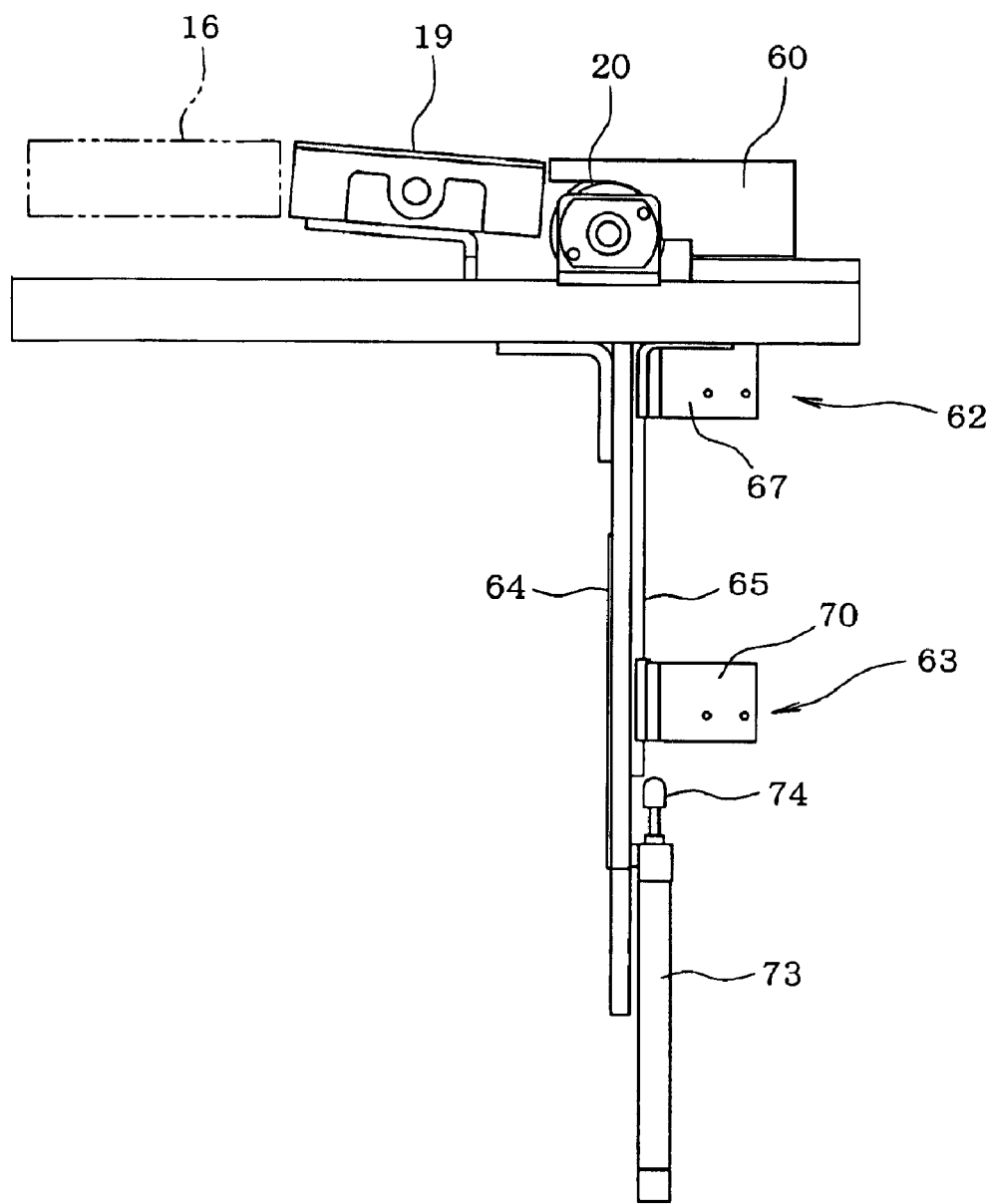
FIG. 10 is a front view of a tensioning mechanism and the periphery thereof.
Figure 11:
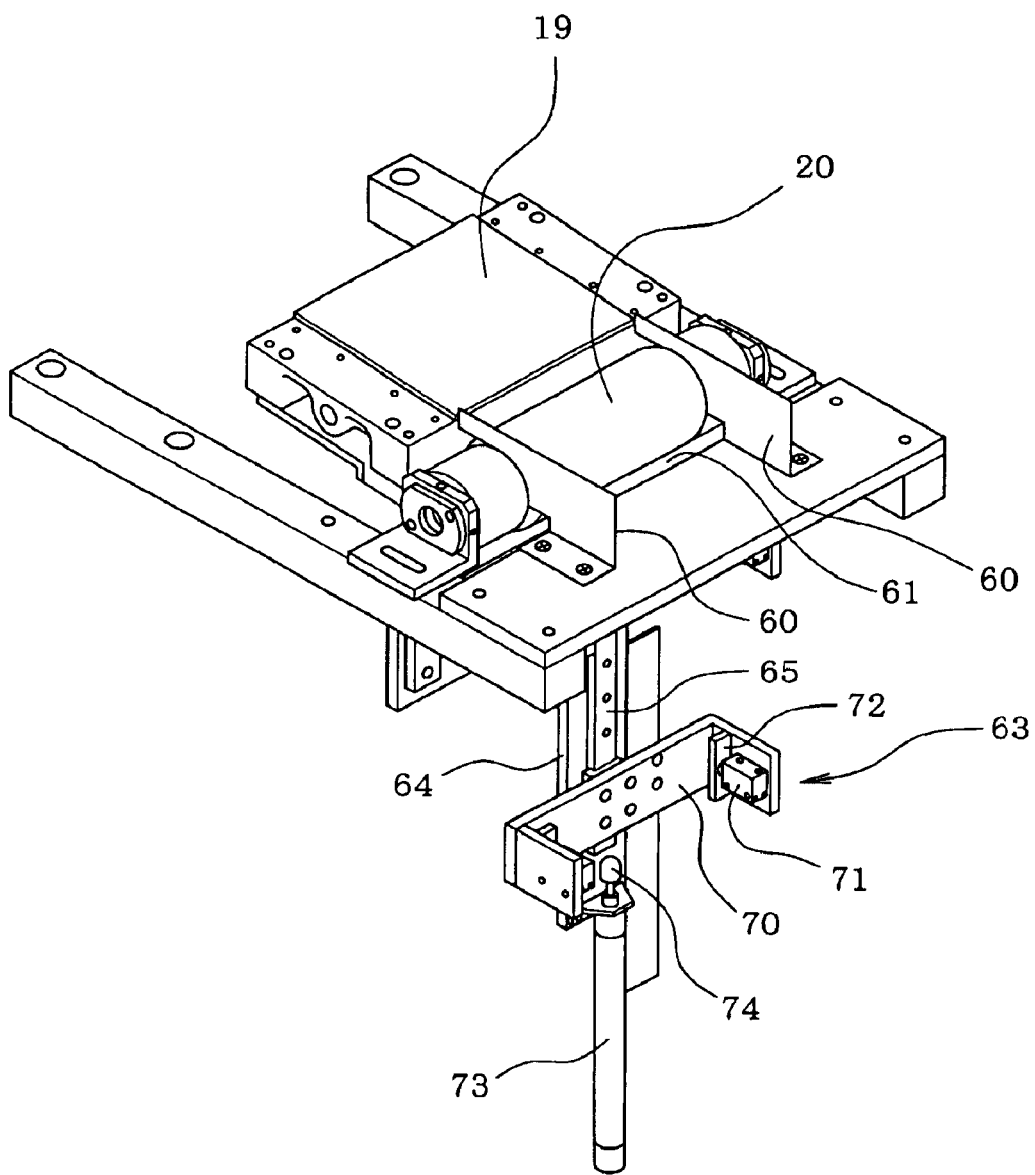
FIG. 11 is a perspective view of the tensioning mechanism and the periphery thereof.
Figure 12:
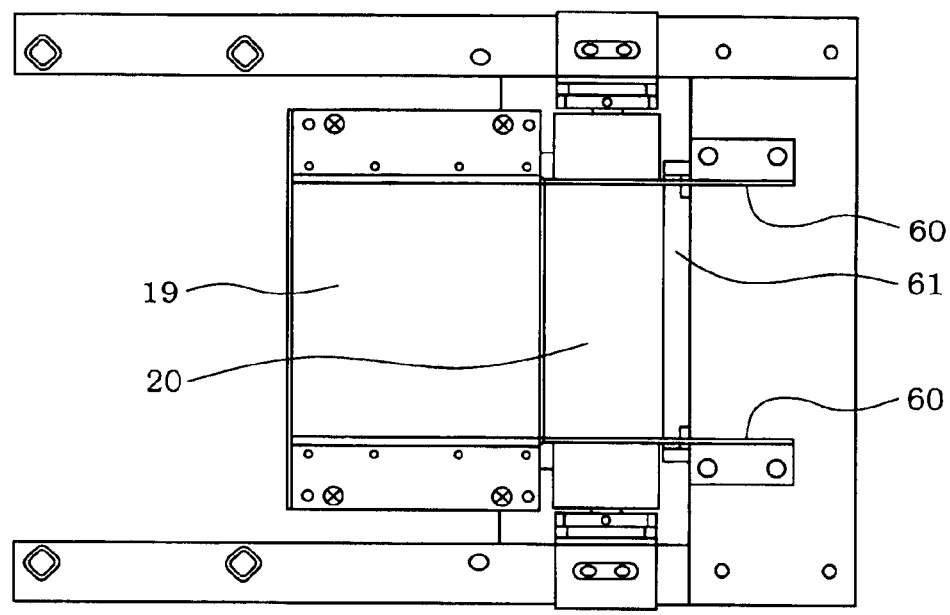
FIG. 12 is a top plan view of a take-out side adsorbing fixed table, feed rollers and periphery.
Figure 13:
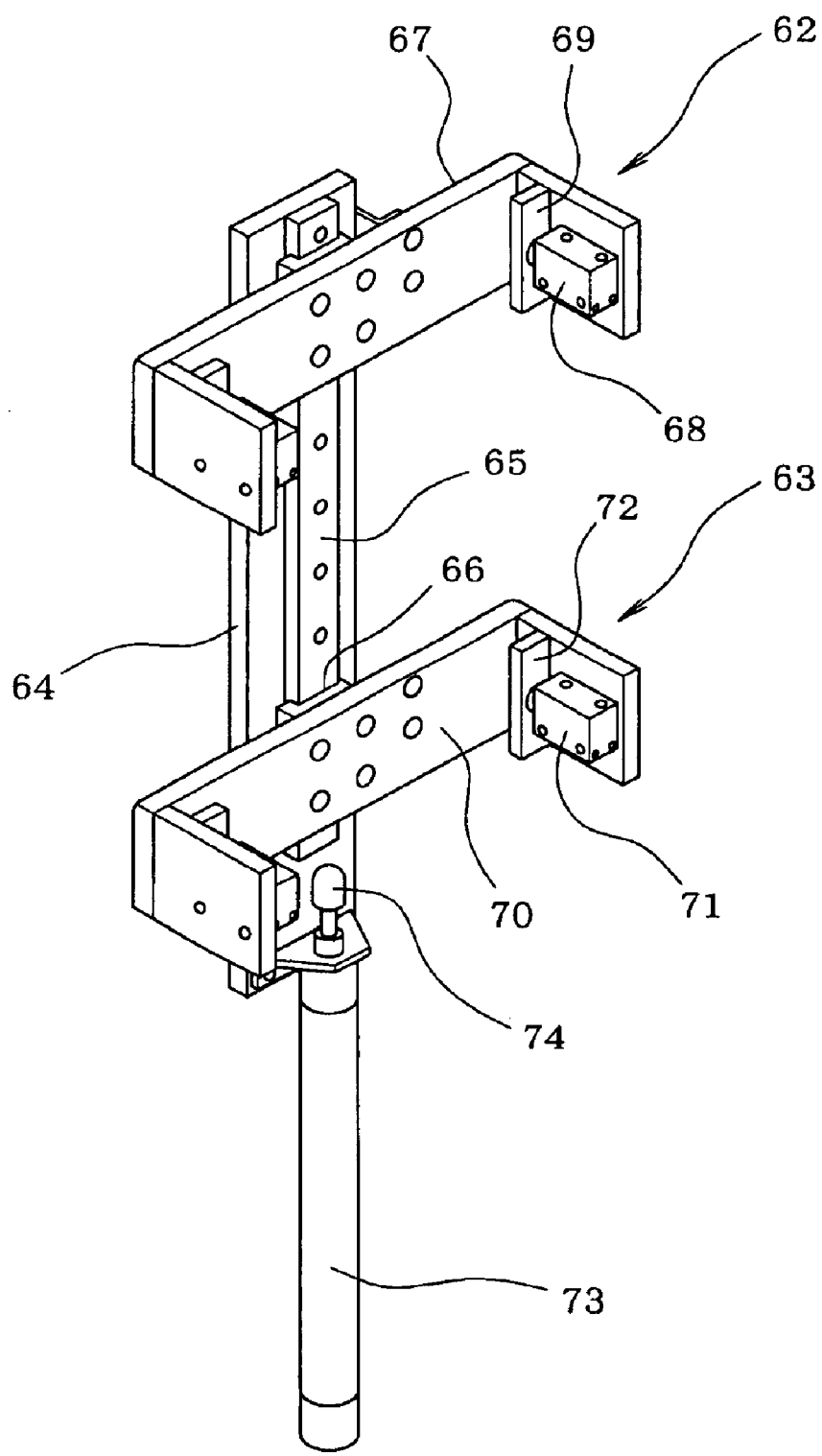
FIG. 13 is a perspective view of the tensioning mechanism.
Figure 14:
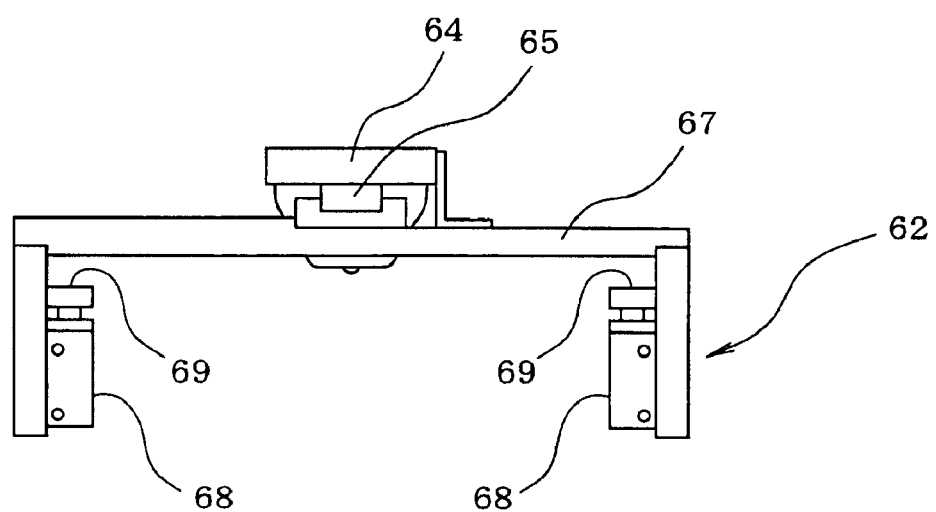
FIG. 14 is a top view of the tensioning mechanism.

A mechanism for tensioning the ceramic green sheet 12 fed out by the feed roller 20 will be described with reference to FIGS. 10 to 14. FIG. 10 is a front view of the tensioning mechanism and the periphery thereof. FIG. 11 is a perspective view of the tensioning mechanism and the periphery thereof. FIG. 12 is a top plan view of a take-out side adsorbing fixed table 19, feed rollers and periphery. FIG. 13 is a perspective view of the tensioning mechanism. FIG. 14 is a top view of the tensioning mechanism.

Two guide plates 60 are provided on both sides of the feed roller 20 for positioning the ceramic green sheet 12 widthwise. The sheet 12 fed between the guide plates 60 by the feed roller 20 is introduced beneath through a sheet introducing slit 61 (see FIGS. 11 and 12).

A fixed clamping apparatus 62 and a movable clamping apparatus 63 (a tensioning apparatus) are supported on a support frame 64 beneath the slit 61. The fixed clamping apparatus 62 is fixed to the support frame 64 so as to be located just beneath the slit 61. The movable clamping apparatus 63 is mounted on a slide fitting member 66 (see FIG. 13) further mounted on a vertically extending rail 65 further mounted on the support frame 64, so as to be slidable vertically.

The fixed clamping apparatus 62 includes two clamping members 69 provided on both sides of a generally C-shaped arm 67 so as to be actuated by an electromagnet 68. When the movable clamping apparatus 63 is moved upward, the clamping members 69 clamp widthwise ends of the sheet 12 thereby to fix the sheet.

On the other hand, the movable clamping apparatus 63 also includes two clamping members 72 (a clamping unit) provided on both sides of a generally C-shaped arm 70 so as to be actuated by an electromagnet 71. The clamping members 72 clamp widthwise ends of the sheet 12 so that the sheet 12 bears the weight of the movable clamping apparatus 63, thereby tensioning the sheet 12. Tension adjusting weights may be mounted to the movable clamping apparatus 63. In this case, a weight to be mounted to the apparatus 63 may be changed according to a required tension.

Furthermore, an air cylinder 73 (a raising apparatus) is mounted on a lower end of the support frame 64 so as to extend vertically. A piston rod 74 of the air cylinder 73 is projected upward so as to push the movable clamping apparatus 63 upward to an upper limit position. A hydraulic cylinder or the like may be provided instead of the air cylinder 73, or an electric motor and a feed screw may be combined into the raising apparatus for raising the movable clamping apparatus 63. The movable clamping apparatus 63, the fixed clamping apparatus 62 and the air cylinder 73 are controlled by a conveyance control microcomputer (a control device) for controlling a conveying operation of the adsorbing and conveying table 16.

The intensive machine thus constructed operates as follows. The ceramic green sheet 12 fed out by the sheet feeding apparatus 11 is adsorbed onto the adsorbing and conveying table 16, which is then moved in the conveying direction by the motor 56, thereby conveying the sheet 12. Consequently, the adsorbing and conveying table 16 is stopped when a part of the sheet 12 in which via holes are to be formed has reached the position of the via hole forming apparatus 22. In this case, when the part of the sheet 12 in which via holes are to be formed reaches the position of the via hole forming apparatus 22, a sheet portion with a previously formed via hole is located at the location of the filling and printing apparatus 24 and a sheet portion with a previously filled and printed portion is located at the location of the wiring pattern printing apparatus 26, simultaneously. Accordingly, when a part of the sheet 12 in which via holes are to be formed has reached the position of the via hole forming apparatus 22, the adsorbing and conveying table 16 is stopped and forming via holes, three steps of filling and printing, and wiring pattern printing are simultaneously carried out.

Upon completion of the three steps, the conveyance of the sheet 12 by the table 16 is re-started and continued until a subsequent portion of the sheet 12 in which via holes are to be formed reaches the position of the via hole forming apparatus 22.

In this case, when the table 16 reaches a limit position in the conveying direction, the atmospheric pressure is introduced into each adsorbing box 45 of the table 16 so that the sheet 12 is released from adsorption by the table 16. The vacuum pressure is introduced into the take-in and take-out adsorbing fixed tables 18 and 19, instead, so that the sheet 12 is adsorbed by the tables 18 and 19, whereby the sheet is prevented from displacement. In this state, the table 16 is moved in the direction opposite the conveying direction. When the table 16 reaches the limit position, the vacuum pressure is introduced into each adsorbing box 45 of the table 16 so that the sheet 12 is adsorbed onto the table 16. Furthermore, the atmospheric pressure is introduced into the take-in and take-out adsorbing fixed tables 18 and 19 so that the sheet 12 is released from adsorption by the tables 18 and 19. In this state, the table 16 is conveyed in the conveying direction, whereby the sheet 12 is conveyed.

When the sheet 12 is adsorbed onto the table 16 and conveyed, the electromagnet 68 of the fixed clamping apparatus 62 is de-energized so that the clamping members 69 are moved to the clamp releasing position, whereby the sheet 12 is released from clamping. Furthermore, the electromagnet 71 of the movable clamping apparatus 63 is energized so that the clamping member 72 is moved to the clamping position, where the clamping members 72 clamp the widthwise ends of the sheet 12 so that the sheet bears the weight of the movable clamping apparatus 63, thereby tensioning the sheet 12. In this state, the movable clamping apparatus 63 is descended according to conveyance of the ceramic green sheet 12.

Every time the movable clamping apparatus 63 is descended to a predetermined descendant position, the widthwise ends of the sheet 12 are clamped by the fixed clamping apparatus 62 during stop of the table 16, whereupon the position of the sheet 12 is fixed. Subsequently, the sheet 12 is released from clamping by the movable clamping apparatus 63, and the apparatus 63 is ascended to an upper limit position near the fixed clamping apparatus 62. Thereafter, the movable clamping apparatus 63 is operated so as to be suspended on the widthwise ends of the sheet 12, whereby the sheet 12 is tensioned. Subsequently, the sheet 12 is released from clamping by the fixed clamping apparatus 62. The movable clamping apparatus 63 is descended according to conveyance of the sheet 12.

During conveyance of the ceramic green sheet 12, an inspecting microcomputer inspects failure of the via holes 33 on the basis of image information obtained from output of the one-dimensional camera 36 of the via hole inspecting apparatus 23. Furthermore, the inspecting microcomputer also inspects failure of the via holes 33 on the basis of image information obtained from output of the one-dimensional camera 42 of the filling and printing inspecting apparatus 25.

In this case, the inspecting microcomputer takes in data of the screen mask 37 used for filling with conductor paste and printing the via hole 33 (or the sand-blasting mask 31 used for forming the via hole 33) to obtain data of the position of the via hole 33. Since the position of an opening of the screen mask 37 or sand-blasting mask 31 accurately coincides with the position of the via hole 33, data of the position of the opening of the screen mask 37 or sand-blasting mask 31 can be used as data of the position of the via hole 33. Accordingly, when the position data of the via hole 33 is obtained on the basis of data of the screen mask 37 or sand-blasting mask 31, position data of the via hole 33 need not be originated and accordingly, a time period required for setup can be reduced.

Alternatively, a sample green sheet previously formed with via holes 33 may be conveyed on the adsorbing and conveying table 16 while the via hole forming apparatus 22 is stopped. The via holes 33 of the sample green sheet may be detected by the via hole inspecting apparatus 23 so that position data of the via hole 33 is obtained. Consequently, since the actual position of the via hole 33 is accurately detected using the via hole inspecting apparatus 23, accurate position data of the via hole 33 can be originated.

In the foregoing embodiment, the inspecting apparatuses 23 and 25 comprise the one-dimensional cameras 36 and 42 both covering the overall width of the sheet 12 respectively, and scan an inspection region of the sheet 12 widthwise (in the direction perpendicular to the conveying direction) in synchronization with conveyance of the sheet. Every time the sheet 12 is moved a predetermined pitch, the one-dimensional cameras 36 and 42 scan the surface of the sheet widthwise at high speeds, thereby supplying one-dimensional image information to the inspecting microcomputer. The one-dimensional image information is stored in time sequence thereby to originate a two-dimensional image of the inspection region of the sheet 12.

The inspecting microcomputer determines whether the via hole has been formed at a position indicated by the stored data, using the image information obtained from the output of the one-dimensional camera 36 of the inspecting apparatus 23, thus inspecting failure in the formed via holes 33.

Furthermore, the inspecting microcomputer measures an amount of transmitted light at the position of each via hole 33, using the image information obtained from the output of the one-dimensional camera 42 of the inspecting apparatus 25. Whether the filling and printing has been carried out is inspected depending upon whether the transmitted light is at or above a predetermined amount of light at the position of each via hole 33. In this case, it is advantageous that safe and inexpensive light sources (light source of visible light or near infrared radiation, for example) can be used as the light sources 35 and 41.

When the ceramic green sheet 12 transmits a small amount of light from the light source therethrough, a sample amount of transmitted light is previously measured, and a reference value for determination of failure in the filling and printing may be set on the basis of the sample amount of transmitted light. Alternatively, when near infrared radiation is used as the light source 41 and transmitted light is detected through an IR filter, only the wavelength of the near infrared radiation can be detected, whereupon the failure in the filling and printing can accurately be detected without being affected by the color of the sheet 12 or light transmitting the sheet.

In the conventional roll-to-roll or roll-to-sheet type, the sheet is conveyed on a conveyer or by a winding force of a winding reel while being tensioned by a tension roller or the like (see Japanese Patent No. 2504277). In this conveying manner, however, the positional relation of the sheet in the conveying direction changes due to an amount of deflection in the sheet caused by a tension roller or the like and accordingly, the sheet needs to be positioned at every station and the position of the sheet needs to be detected at every station. As a result, the construction of the apparatus becomes complicated and expensive.

In the embodiment, however, the adsorbing and conveying table 16 is used as means for conveying the ceramic green sheet 12 fed out of the roll 13. Thus, the sheet 12 is conveyed while being adsorbed and held by the air suction force (vacuum pressure) on the adsorbing and conveying table 16, whereupon creases need not be removed from the sheet 12 by a tension roller or the like during conveyance and accordingly, the sheet 12 can be conveyed in a straight flat state. Accordingly, since the ceramic green sheet 12 can be prevented from relative displacement in the conveying direction, desired feed pitch accuracy can be ensured. Since the sheet 12 need not be positioned and the position detection need not be carried out at every step, the apparatus at each step can be simplified. Consequently, the apparatuses at the respective steps can compactly be provided intensively on the platform 15 supporting the adsorbing and conveying table 16 and accordingly, small-sized fabricating installation, a reduction in the number of assembling steps and low costs can be realized. Moreover, a stable sheet feeding accuracy can be ensured without adjustment of roller tension according to the thickness or material of the sheet 12, and high quality of products can be fabricated efficiently.

In order that the air suction force (vacuum pressure) may be applied to the sheet 12, the top of the adsorbing and conveying table 16 needs to be comprised of a porous plate. However, the air suction force deforms the sheet 12 when the porous plate has a large pore diameter. Accordingly, the pore diameter of the porous plate needs to be rendered minute. As a method of forming the porous plate, it is supposed that a metal plate is made into a porous plate by punching. However, it is difficult to form minute pores by punching in a metal plate with such an increased thickness that a strength required for the top of the adsorbing and conveying table 16 may be ensured. It is then supposed that a porous plate is made of a sintered metal, but the sintered metal is disadvantageously expensive.

In the embodiment, however, the adsorbing and conveying table 16 has a top comprising a laminated porous plate 54 made by laminating at least two metal plates 52 and 53 each having a number of minute pores, and the metal plates 52 and 53 are laminated so that the pores of the upper metal plate 52 face the pores of the lower metal plate 53 and the pores of the upper metal plate 52 are smaller than the pores of the lower metal plate 53. More specifically, a metal plate 52 with a small thickness can be formed with minute pores by punching etc. but cannot ensure the strength required for the top of the adsorbing and conveying table 16. On the other hand, a metal plate 53 with a large thickness can ensure the required strength but minute pores cannot be formed in the metal plate.

In view of the above-described point, the laminated porous plate 54 is formed by stacking a metal plate 53 having a larger thickness and larger pores formed by punching on a thinner metal plate 52 having smaller pores formed by punching. When the laminated porous plate 54 is used, the thinner metal plate 52 formed with minute pores can be reinforced by the thicker metal plate 53 having a higher strength, at the underside of the thinner metal plate. Consequently, the top of the adsorbing and conveying table has required small pore diameter and higher strength. Moreover, the laminated porous plate 54 is advantageously less expensive than the continuously porous sintered metal. The laminated porous plate 54 may be formed by laminating three or more metal plates each of which is formed with a number of minute pores.

However, a sintered metal plate with a continuous microporous structure may be used instead of the laminated porous plate 54 and the object of the present invention can be achieved in this case, too.

Furthermore, the adsorbing fixed tables 18 and 19 are installed at the take-in and take-out sides of the adsorbing and conveying table 16 respectively. The adsorbing and conveying table 16 is reciprocated between the adsorbing fixed tables 18 and 19 so that the ceramic green sheet 12 is conveyed.

Furthermore, the adsorbing and conveying table 16 includes a take-in side and a take-out side on both of which adsorbing fixed tables 18 and 19 are provided respectively. The adsorbing and conveying table 16 is moved reciprocally between the take-in and take-out side adsorbing fixed tables 18 and 19, thereby conveying the sheet 12. The sheet 12 is released from adsorption by each of the take-in and take-out side adsorbing fixed tables 18 and 19 when conveyed while being adsorbed on the adsorbing and conveying table 16. The sheet 12 is released from adsorption by the adsorbing and conveying table 16 when the adsorbing and conveying table is moved backward to the direction opposite the conveying direction. The sheet 12 is adsorbed by the take-in and take-out side adsorbing fixed tables 18 and 19 so as to be prevented from displacement. Consequently, since the sheet 12 can be prevented from displacement when the adsorbing and conveying table 16 is moved backward to the direction opposite the conveying direction, a desired sheet feed pitch accuracy can be maintained and the sheet 12 can be conveyed in a straight flat state.

When a wiring pattern printing step is a final step of the intensive machine as in the embodiment, there is a possibility that a part of screen mask 37 used for wiring pattern printing may extend over the take-out side adsorbing fixed table 19. In this case, since the wiring pattern placed over the take-out side adsorbing fixed table 19 is undried, the screen mask 43 may adheres to the undried wiring pattern of the sheet on the take-out side adsorbing fixed table 19 when the take-out side adsorbing fixed table 19 is installed horizontally, whereupon a line width of the undried wiring pattern may blot and spread or become blurred. Thus, the quality of the printed wiring pattern would be reduced.

In the embodiment, however, the take-out side adsorbing fixed table 19 includes a top inclined downward toward the take-out side. Consequently, the screen mask 43 can be prevented from adhering to the undried wiring pattern of the sheet 12 on the take-out side adsorbing fixed table 19 and accordingly, the undried wiring pattern can be prevented from blotting or blurring.

The sheet 12 fed out of the adsorbing and conveying table 16 can be conveyed in a straightly stretched state when tensioned so as to be stretched in the conveying direction in the case where the sheet 12 is conveyed while being adsorbed and held on the adsorbing and conveying table 16. Consequently, the sheet feed pitch accuracy can further be improved. However, when a tension roller is used as means for tensioning the sheet 12, the tension roller may be brought into contact with the undried wiring pattern of the sheet 12, whereupon the line width of the undried wiring pattern may blot and spread or become blurred. Thus, the quality of the printed wiring pattern would be reduced.

In the embodiment, however, a feed roller is provided for catching the sheet 12 fed from the adsorbing and conveying table 16 so that the sheet 12 hangs down on the feed roller. A movable clamping unit 63 clamps widthwise ends of the sheet 12 hanging down from the feed roller, whereby the sheet 12 is tensioned by the weight of the clamping unit 63. Consequently, the movable clamping unit 63 serving as the tensioning apparatus can tension the sheet 12 without coming into contact with the undried wiring pattern of the sheet and accordingly prevent reduction in the quality of the printed wiring pattern.

Furthermore, in the embodiment, a fixed clamping unit 62 is provided over the movable clamping unit 63. Every time the movable clamping unit 63 is descended to a predetermined descending position, the widthwise ends of the sheet are clamped by the fixed clamping unit during stop of the adsorbing and conveying table 16, whereby a position of the sheet is fixed. Thereafter, the sheet is released from clamping by the movable clamping unit 63 and the movable clamping unit is raised to the predetermined ascending position near the fixed clamping unit 62 by the air cylinder 73. Thereafter, the movable clamping unit 63 is operated to clamp the widthwise ends of the sheet 12 so as to suspend on the widthwise ends of the sheet 12 so that the sheet 12 is tensioned. Sheet 12 is thereafter released from clamping by the fixed clamping unit 62. Accordingly, the position of the sheet 12 can be fixed by the fixed clamping unit 62 when the movable clamping unit 63 is raised. Consequently, displacement of the sheet 12 can reliably be prevented when the movable clamping unit 63 is raised.

Two-dimensional cameras such as CCD cameras may be used as light detecting units of the via hole inspecting apparatus 23 and the filling and printing inspecting apparatus 25, instead of the one-dimensional cameras. In use of the two-dimensional cameras, the inspecting region of the ceramic green sheet 12 is divided into a plurality of camera regions. While the conveyance of the sheet 12 is temporarily interrupted by the filling and printing of the via hole 33, imaging is carried out by the two-dimensional camera in one camera region, and thereafter, the two-dimensional camera is moved to the neighbor camera region so that imaging is carried out. The process is repeated so that image information of the overall inspecting region is obtained. Consequently, portions of the sheet 12 previously formed with the via holes 33 or filled with conductor past and printed can be inspected during temporal stop of conveyance of the sheet 12 for filling the via hole 33 with conductor paste and printing, whereupon forming via holes, filling and printing, and inspection can be carried out simultaneously.

The two-dimensional camera and light source may be moved together when the two-dimensional camera is moved. However, when a surface light source which can illuminate the overall detected portion, the surface light source need not be moved.

In the intensive machine of the embodiment, on the intensive platform 15 are installed the via hole forming apparatus 22, via hole inspecting apparatus 23, filling and printing apparatus 24, filling and printing inspecting apparatus 25 and wiring pattern printing apparatus 26. However, for example, the via hole inspecting apparatus 23 and/or the filling and printing inspecting apparatus 25 may be eliminated or a wiring pattern inspecting apparatus for inspecting a wiring pattern by a camera etc. may be added after the wiring pattern printing apparatus 26. Furthermore, a positioning hole forming apparatus for forming a positioning hole may be added before the via hole forming apparatus 22 or a drying apparatus for drying a wiring pattern may be added after the wiring pattern printing apparatus 26 (or after the wiring pattern inspecting apparatus). Alternatively, a sheet cutting apparatus may be added for cutting the sheet 12 into a product substrate size at the final step on the platform 15.

In short, on the intensive platform 15 are provided at least the via hole forming apparatus 22, filling and printing apparatus 24 and wiring pattern printing apparatus 26 in the invention. The other apparatus may be added, if necessary.

A plastic sheet for multilayer substrate may be used instead of the ceramic green sheet. Furthermore, as a method of forming the via holes, laser beam machining or punching may be used instead of the sand blasting.

What is claimed is:

1. An intensive machine performing a plurality of processes in a series of steps of fabricating a multilayer substrate, comprising:
    a roll of insulating sheet formed into an insulating layer of each of a plurality of layers of the multilayer substrate;
    an adsorbing and conveying table adsorbing the sheet fed out of the roll by an air suction force and holding the adsorbed sheet, the table further conveying the sheet while holding the sheet;
    an intensive platform supporting the adsorbing and conveying table so that the table is reciprocally moved in a conveying direction of the table and a direction opposed to the conveying direction;
    a via hole forming apparatus provided on the intensive platform for forming a via hole in the sheet held on the table in an adsorbed state;
    a filling and printing apparatus provided on the platform so as to be disposed over the sheet having passed the via hole forming apparatus by a feeding operation of the table to fill the via hole with a conductor paste and print the conductor paste on the sheet; and
    a wiring pattern printing apparatus provided on the platform so as to be disposed over the sheet having passed the filling and printing apparatus by a feeding operation of the table to print a wiring pattern on the sheet.

2. An intensive machine according to claim 1, further comprising a via hole inspecting apparatus provided between the via hole forming apparatus and the filling and printing apparatus for inspecting a failure in the via hole and a filling and printing inspecting apparatus provided between the filling and printing apparatus for inspecting quality in the filling and printing of the via hole.

3. An intensive machine according to claim 1, wherein distances between the via hole forming apparatus, the filling and printing apparatus and the wiring pattern printing apparatus are set so that steps of via hole forming, filling and printing, and wiring pattern printing are carried out simultaneously.

4. An intensive machine according to claim 1, wherein the sheet is a ceramic green sheet formed on a carrier film, and the via hole forming apparatus forms the via hole only on the ceramic green sheet so that the via hole is prevented from extending through the carrier film.

5. An intensive machine according to claim 1, wherein the adsorbing and conveying table has a top comprising a laminated porous plate made by laminating at least two metal plates each having a number of minute pores, the metal plates are laminated so that the pores of the upper metal plate face the pores of the lower metal plate and the pores of the upper metal plate are smaller than the pores of the lower metal plate so that air is sucked through the pores of the laminated porous plate to the lower metal plate side, whereby the sheet is adsorbed and held on the laminated porous plate.

6. An intensive machine according to claim 1, wherein:
    the adsorbing and conveying table includes a take-in side and a take-out side on both of which adsorbing fixed tables are provided respectively;
    the adsorbing and conveying table is moved reciprocally between the take-in and take-out side adsorbing fixed tables, thereby conveying the sheet;
    the sheet is released from adsorption by each of the take-in and take-out side adsorbing fixed tables when conveyed while adsorbed on the adsorbing and conveying table;
    the sheet is released from adsorption by the adsorption and conveying table when the adsorption and conveying table is moved backward to the direction opposite the conveying direction; and
    the sheet is adsorbed by the take-in and take-out side adsorbing fixed tables so as to be prevented from shifting.

7. An intensive machine according to claim 6, wherein the take-out side adsorbing fixed table includes a top inclined downward toward the take-out side.

8. An intensive machine according to claim 1, further comprising:
    a feed roller catching the sheet fed from the adsorbing and conveying table so that the sheet hangs down on the feed roller;
    a tensioning apparatus including a clamping unit and suspended on widthwise ends of the sheet hanging down from the feed roller by the clamping unit, thereby tensioning the sheet;
    a raising apparatus raising the tensioning apparatus; and
    a control device controlling the clamping unit of the tensioning apparatus and the raising apparatus,
    wherein every time the tensioning apparatus is descended to a predetermined descending position, the control device releases the clamping unit from a clamping state and controls the raising apparatus so that the tensioning apparatus is raised to a predetermined ascending position and thereafter, controls the raising apparatus so that the clamping unit clamps the widthwise ends of the sheet so that the tensioning apparatus is suspended on the widthwise ends of the sheet.

9. An intensive machine according to claim 8, wherein the control device controls so that raising the tensioning apparatus to the predetermined ascending position is carried out during stop of the adsorbing and conveying table.

10. An intensive machine according to claim 9, further comprising a clamping and fixing apparatus provided over the tensioning apparatus for clamping and fixing the widthwise ends of the sheet, wherein every time the tensioning apparatus is descended to a predetermined descending position, the control device controls so that the widthwise ends of the sheet are clamped by the clamping and fixing apparatus during stop of the adsorbing and conveying table, thereby fixing a position of the sheet, and thereafter releases the clamping unit of the tensioning apparatus from the clamping state and controls so that the tensioning apparatus is raised to the predetermined ascending position by the raising apparatus, the control device thereafter controlling so that the clamping unit of the tensioning apparatus clamps the widthwise ends of the sheet so that the tensioning apparatus is suspended on the widthwise ends of the sheet, and thereafter releasing the clamping and fixing apparatus from the clamping state.

* * * * *